(12) United States Patent
Lopez et al.

(10) Patent No.: US 9,709,622 B2
(45) Date of Patent: Jul. 18, 2017

(54) DIRECT INJECTION PHASE CHANGE TEMPERATURE CONTROL SYSTEM

(71) Applicant: SENSATA TECHNOLOGIES, INC., Attleboro, MA (US)

(72) Inventors: Christopher A. Lopez, Phoenix, AZ (US); Thomas F. Lemczyk, Phoenix, AZ (US); Rick A. Davis, Peoria, AZ (US)

(73) Assignee: Sensata Technologies, Inc., Attleboro, MA (US)

( * ) Notice: Subject to any disclaimer, the term of this patent is extended or adjusted under 35 U.S.C. 154(b) by 427 days.

(21) Appl. No.: 14/210,084

(22) Filed: Mar. 13, 2014

(65) Prior Publication Data

US 2014/0260333 A1    Sep. 18, 2014

Related U.S. Application Data

(60) Provisional application No. 61/789,203, filed on Mar. 15, 2013.

(51) Int. Cl.
*G01R 31/00* (2006.01)
*G01R 31/26* (2014.01)
*F28D 15/02* (2006.01)
*G01R 31/28* (2006.01)

(52) U.S. Cl.
CPC ............ *G01R 31/26* (2013.01); *F28D 15/02* (2013.01); *G01R 31/2874* (2013.01); *H01L 2924/0002* (2013.01)

(58) Field of Classification Search
CPC .... G01B 5/066; G01R 1/07314; G01R 31/00; G01R 31/2851; G01R 31/2862; G01R 31/2877; G01R 31/2893
See application file for complete search history.

(56) References Cited

U.S. PATENT DOCUMENTS

| 4,802,370 A | * | 2/1989 | EerNisse | ................. G01L 9/085 310/338 |
| 5,198,753 A | | 3/1993 | Hamburgen | |
| 7,030,640 B2 | * | 4/2006 | Yee | .................... G01R 31/2875 324/750.01 |
| 7,100,389 B1 | | 9/2006 | Wayburn et al. | |
| 7,373,967 B1 | | 5/2008 | Tustaniwskyj et al. | |
| 2004/0139756 A1 | | 7/2004 | Wall et al. | |
| 2005/0146708 A1 | * | 7/2005 | Shi | ....................... G01B 11/162 356/35.5 |

(Continued)

FOREIGN PATENT DOCUMENTS

JP       2012185184 A       9/2012

OTHER PUBLICATIONS

European Search Report for European Patent Application No. 14160006.4 dated Apr. 7, 2017, 10 pages.

*Primary Examiner* — Tung X Nguyen
(74) *Attorney, Agent, or Firm* — Burns & Levinson LLP; George N. Chaclas; Daniel McGrath

(57) ABSTRACT

A thermal control unit (TCU) for controlling temperature of a device under test (DUT) includes a sealed evaporation chamber disposed therein, the evaporation chamber configured with a refrigerant inlet and a refrigerant outlet; and at least one surface for thermal engagement of the device under test and configured to conduct heat to the evaporation chamber. A test system and a computer program product are disclosed.

20 Claims, 9 Drawing Sheets

(56) References Cited

U.S. PATENT DOCUMENTS

| | | |
|---|---|---|
| 2005/0280144 A1 | 12/2005 | Wayburn et al. |
| 2006/0245161 A1 | 11/2006 | Maruyama et al. |
| 2007/0013394 A1 | 1/2007 | Tustaniwskyj et al. |
| 2008/0223555 A1* | 9/2008 | Di Stefano .............. F25B 49/02 165/101 |
| 2009/0183866 A1* | 7/2009 | Sakaue .............. G01R 31/2875 165/287 |
| 2011/0011564 A1 | 1/2011 | Ooi et al. |
| 2011/0226442 A1 | 9/2011 | Tustaniwskyj et al. |

* cited by examiner

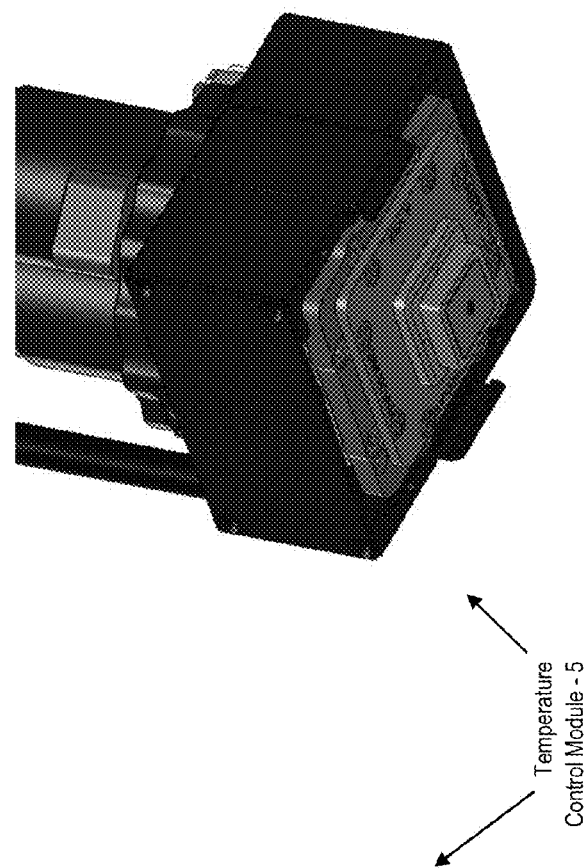
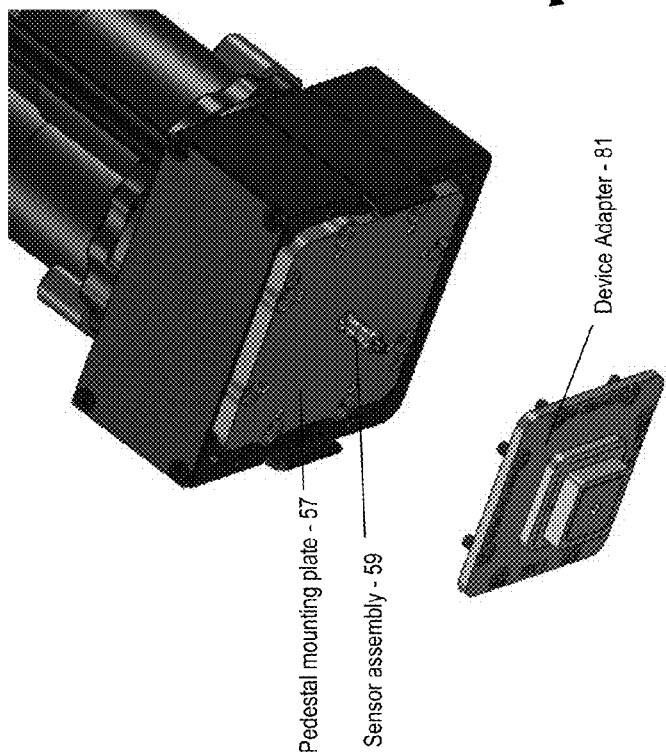
Fig. 8A
Fig. 8B

DIRECT INJECTION PHASE CHANGE TEMPERATURE CONTROL SYSTEM

BACKGROUND OF THE INVENTION

1. Field of the Invention

The invention disclosed herein relates to semiconductor test hardware, in particular, to a refrigeration system for testing semiconductor devices.

2. Description of the Related Art

As the world is increasingly reliant on semiconductor technology, failure of semiconductor components is of increasing concern. Testing of semiconductor devices is increasingly important. More specifically, it is particularly desirable to learn failure modes of semiconductor devices such that new designs can effectively overcome deficiencies. Unfortunately many test apparatus do not provide for adequate temperature control of devices under testing, and therefore present test protocols have limited value.

Thus, what are needed are methods and apparatus to enhance testing of semiconductor devices.

SUMMARY OF THE INVENTION

In one embodiment, a thermal control unit (TCU) for controlling temperature of a device under test (DUT) is disclosed. The unit includes a sealed evaporation chamber disposed therein, the evaporation chamber configured with a refrigerant inlet and a refrigerant outlet; and at least one surface for thermal engagement of the device under test and configured to conduct heat to the evaporation chamber.

In some embodiments, the evaporation chamber is disposed within a cold plate assembly; the cold plate assembly may include a body and a transfer plate mounted thereto; the cold plate assembly may include a seal disposed between the body and the transfer plate, wherein the transfer plate may be configured to transfer heat from the test device to the refrigerant. In some embodiments, the TCU includes at least one thermoelectric cooler (TEC). In some embodiments, the TCU includes at least one pedestal mounting plate; wherein the at least one pedestal mounting plate may include a mount for a sensor assembly. In some embodiments, the sensor assembly further comprises a mount for a device adapter; and the device adapter may be configured for thermal transfer from the device under test. In some embodiments, the TCU includes at least one heater; and the at least one heater may include a resistive element. In some embodiments, the TCU is configured for use with at least one of R404a and R134a refrigerant. In some embodiments, the TCU includes a thermal transfer material disposed on at least one surface of a transfer plate, a thermoelectric cooler, a pedestal mounting plate and a sensor assembly. In some embodiments, the TCU includes at least one temperature sensor, and/or at least one humidity sensor.

In another embodiment, a test system for testing thermal response of a semiconductor device is provided. The test system includes: a thermal control unit (TCU) for controlling temperature of the semiconductor, the unit including a sealed evaporation chamber disposed therein, the evaporation chamber configured with a refrigerant inlet and a refrigerant outlet, wherein the unit comprises at least one surface for thermal engagement of the semiconductor device and configured to conduct heat to the evaporation chamber; a controller for receiving a control signal and controlling operation of the thermal control unit (TCU) according to the signal.

In some embodiments of the test system, the control signal is provided by one of a user interface and a sensor of the thermal control unit (TCU). In some embodiments of the test system, the controller is configured to execute machine executable instructions stored on machine readable media, the instructions for controlling the operation.

BRIEF DESCRIPTION OF THE DRAWINGS

The features and advantages of the invention are apparent from the following description taken in conjunction with the accompanying drawings in which:

FIGS. 8A and 8B, collectively referred to herein as FIG. 8, is a bottom perspective view of the thermal control head of FIG. 6;

DETAILED DESCRIPTION OF THE INVENTION

Disclosed herein are methods and apparatus for controlling temperature of test devices. In particular, the methods and apparatus disclosed herein are particularly useful for controlling temperature (i.e., thermal conditions) of semiconductor devices during testing. Accordingly, the exemplary embodiments discussed herein are presented in terms of semiconductor devices. However, this is not to be construed as limiting of the teachings herein. That is, the technology disclosed herein may be applied equally well to any type of miniature device where control of thermal conditions is desired.

Figure 1:
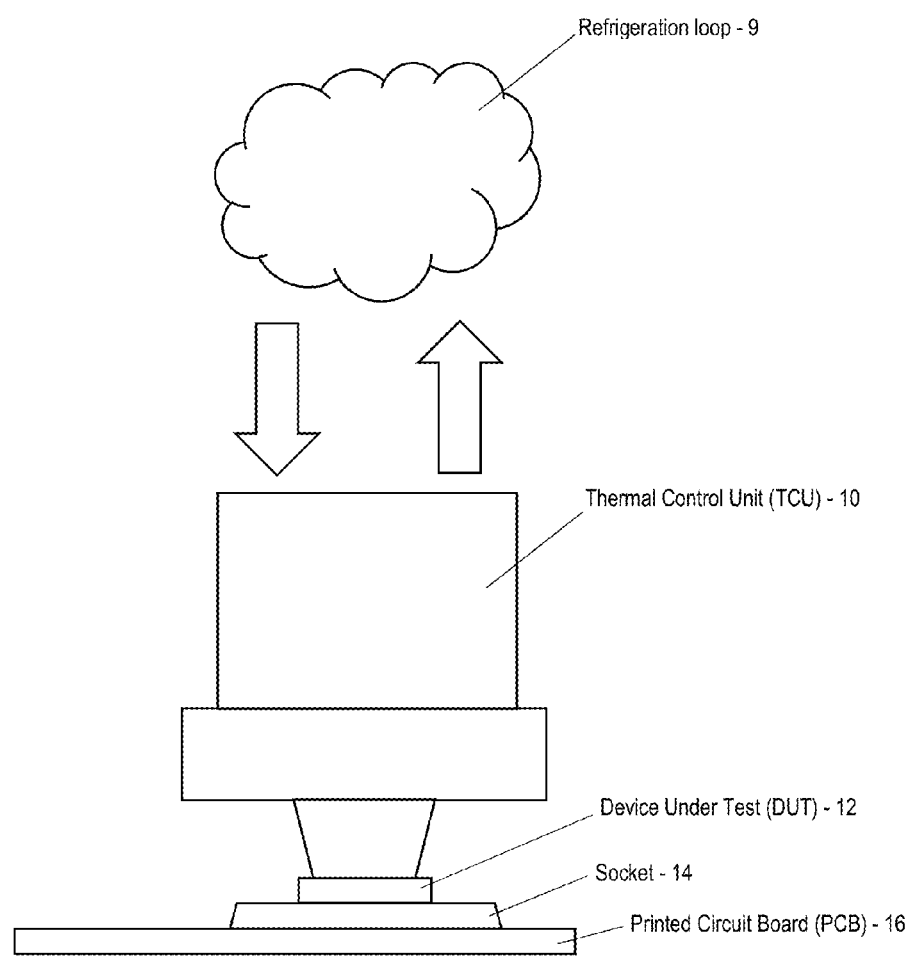
FIG. 1 is a schematic diagram depicting a thermal control unit (TCU) for thermal testing of small devices.

Refer now to FIG. 1, where aspects of a thermal control unit (TCU) 10 are shown. During use, the thermal control unit (TCU) 10 maintains an interface with components in a refrigeration loop 9. The refrigeration loop 9 includes components such as a condenser and a compressor. Other components of the refrigeration loop 9 may be included externally of or within the thermal control unit (TCU) 10. Additionally, the thermal control unit (TCU) 10 maintains an interface with a device under test (DUT) 12. In turn, the device under test (DUT) 12 may be coupled to a socket 14 and/or a printed circuit board (PCB) 16. The socket 14 and/or printed circuit board (PCB) 16 generally provide for communications from the device under test (DUT) 12 to external test equipment (shown below in FIG. 10). Exemplary external test equipment include oscilloscopes, power supplies, voltage meters and other such test devices.

It should be recognized that the term "refrigeration loop" generally refers to components that are external to the thermal control unit (TCU) 10 and supportive of a gaseous refrigeration cycle. More specifically, at least some components of the conventional "refrigeration loop" may be disposed within the thermal control unit (TCU) 10. Accordingly, the term refrigeration loop should not be construed as requiring all components causing refrigeration to be external of the thermal control unit (TCU) 10.

Generally, the device under test (DUT) 12 includes any type of device that is suited for testing. Exemplary embodiments of the device under test (DUT) 12 include integrated circuits of all varieties. Generally, use of the thermal control unit (TCU) 10 for testing of the device under test (DUT) 12 is limited only by aspects of the transfer. More specifically, and as an example, use of the thermal control unit (TCU) 10 may only be limited by an ability to thermally interface the thermal control unit (TCU) 10 with the device under test (DUT) 12.

Figure 2A:
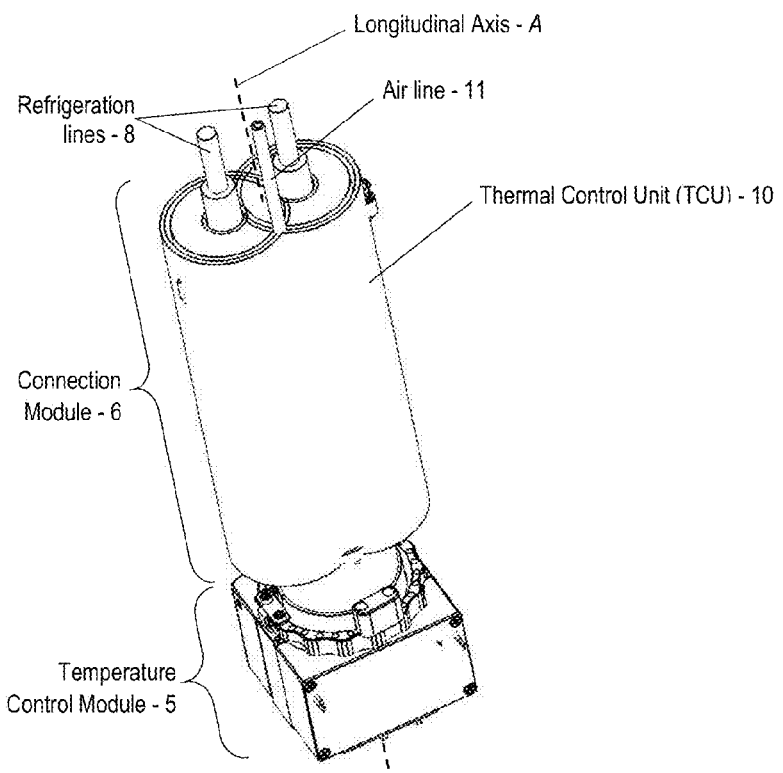
FIGS. 2A and 2B, collectively referred to herein as FIG. 2, are perspective views of the thermal control unit (TCU) of FIG. 1.
Figure 2B:
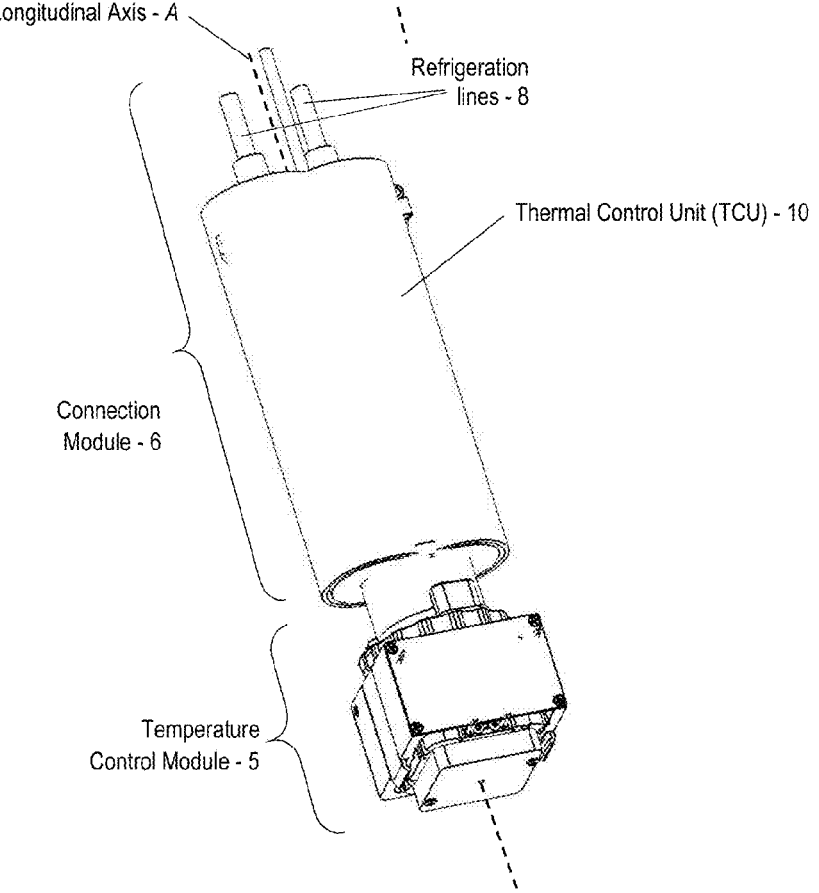

Referring now to FIGS. 2A and 2B, a perspective view of an embodiment of the thermal control unit (TCU) 10. In this example, thermal control unit (TCU) 10 is generally an oblong device centered about a longitudinal axis, A. Arbitrarily, the thermal control unit (TCU) 10 may be considered as being divided into two components. A first component is referred to as a connection module 6. A second component is referred to as a temperature control module 5.

Figure 3:
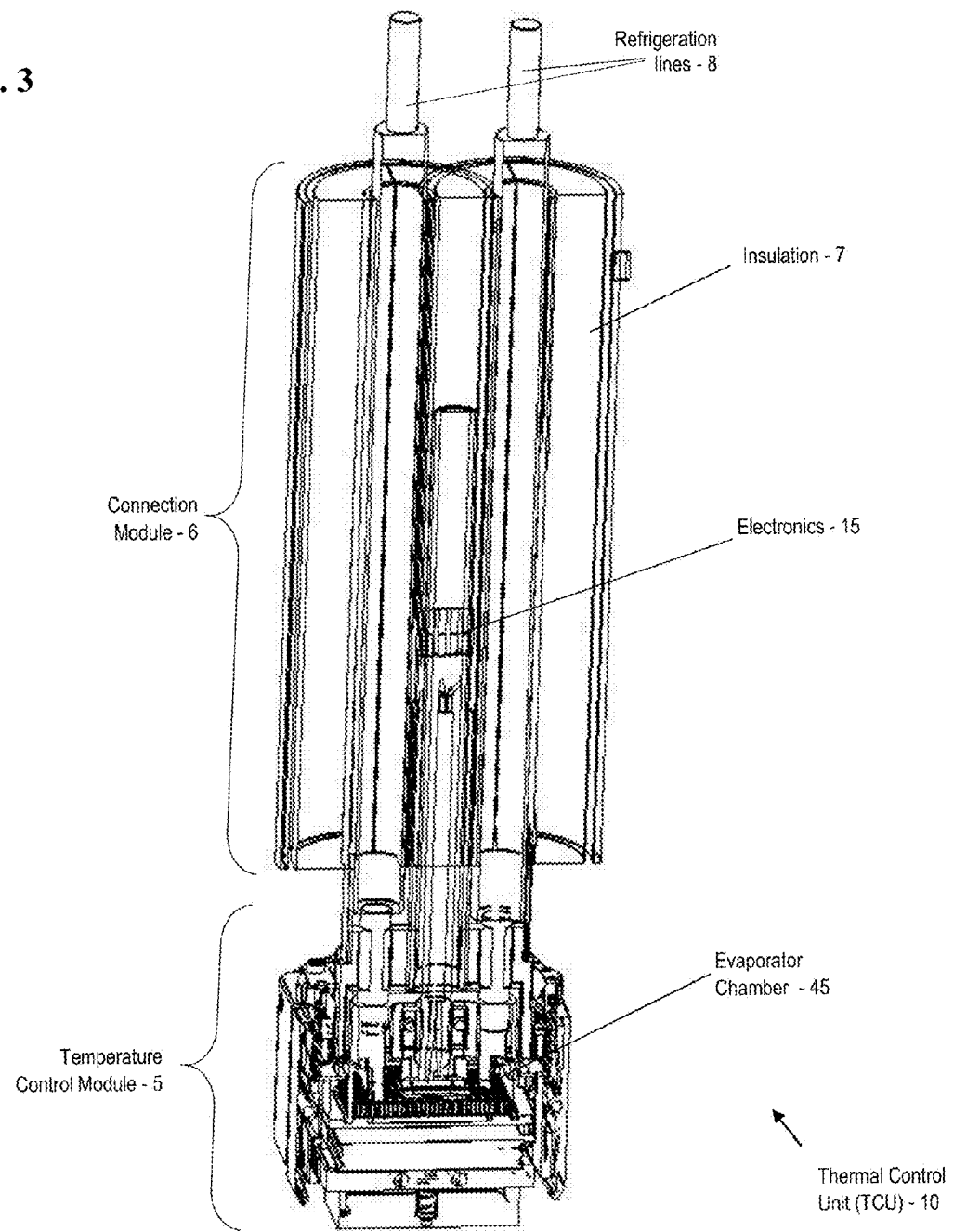
FIG. 3 is a cutaway perspective view of the thermal control unit (TCU) of FIGS. 1 and 2.

Generally, the connection module 6 includes refrigeration lines 8 (and inlet line and an outlet line). Additionally, the thermal control unit (TCU) 10 may include at least one air line 11. As also shown in FIG. 3, the connection module 6 may include insulation 7. The insulation 7 may be oriented to surround the refrigeration lines 8 and preserve thermal performance. A connection module 6 may include electronics 15. Generally, the electronics 15 communicate with the temperature control module 5.

Generally, the temperature control module 5 includes components for heating the device under test (DUT) 12 and also for cooling the device under test (DUT) 12. The temperature control module 5 further includes sensing components for sensing temperature of the device under test (DUT) 12.

Figure 4:
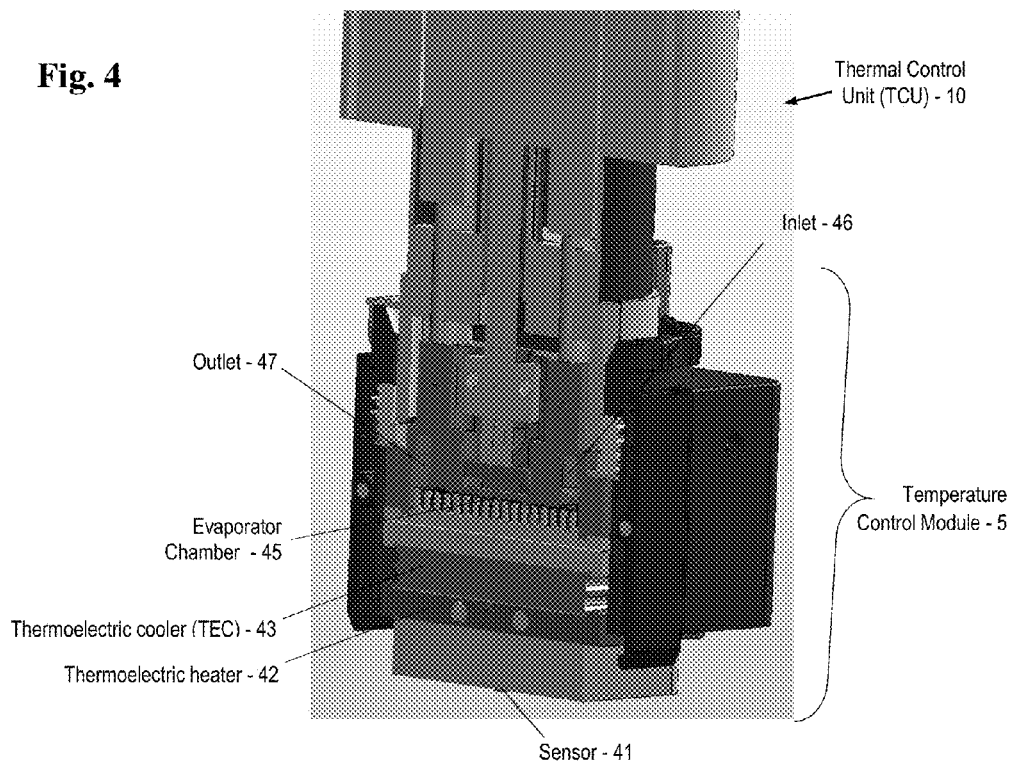
FIGS. 4 and 5 are cutaway perspective views of a temperature control module for the thermal control unit (TCU) of FIGS. 1, 2 and 3.
Figure 5:
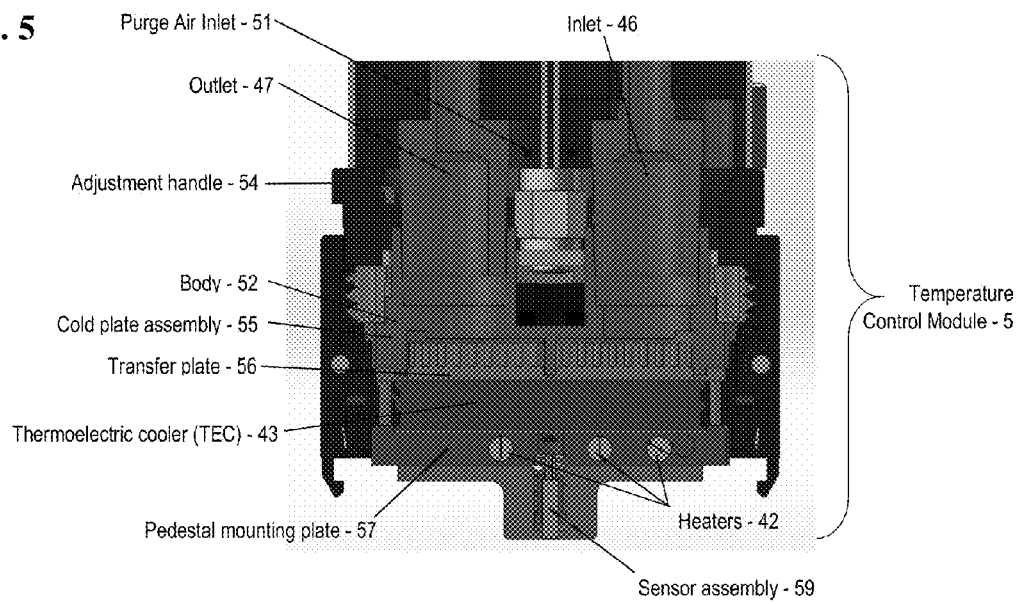

Refer now also to FIGS. 4 and 5, where cutaway views of an exemplary embodiment of the temperature control module 5 are shown. Components of the exemplary embodiment include an inlet 46 and an outlet 47. The inlet 46 receives compressed refrigerant from the refrigeration loop 9 and dispenses the refrigerant into an evaporator chamber 45 (also referred to herein as an evaporator). The inlet 46 may include at least one nozzle (not shown) for dispensing the refrigerant.

Liquid and vapor carry away heat from the evaporator chamber 45 through the outlet 47. Generally, the evaporator chamber 45 includes a transfer plate 56. The transfer plate 56 may include features such that refrigerant from the inlet 46 is distributed over a large surface area, thus causing efficient heat exchange. Exemplary features includes a plurality of upwardly extending fingers (as shown), fins, ridges, wires, or other thermally conductive components.

Additionally, the temperature control module 5 may include a purge air inlet 51. The purge air inlet 51 may be supplied with a supply of dry air through the air line 11. Generally, a purge gas (such as, for example, air, or nitrogen) may be supplied to the thermal control unit (TCU) 10 in order to limit condensation. When used to prevent condensation (collection of frost), the purge gas generally maintains a dewpoint below that of the coldest surface exposed to the purge gas. In some embodiments, the dewpoint is maintained below about −40 degrees Celsius to −55 degrees Celsius, which an operational temperature for the coldplate to the pedestal end.

Generally, the purge gas is supplied such that it will pass over these cold surfaces in a free-flowing manner. The flow may be supplied such that a minimal pressure drop occurs without causing undue heat transfer to the purge gas. In some embodiments, the purge gas is circulated in a closed loop. In some embodiments the purge gas is vented at some lower location (for example, it gaps in lower socket joints etc). Generally, aspects of the purge gas are controlled by a controller (for example, the controller depicted in FIG. 9).

System designers may account for use of purge gas when considering other aspects of the system design. For example, heat transfer in the purge gas may provide for reduction in the quantity of insulation 7 that is used. Accordingly, use of purge gas aids in smaller designs for the thermal control unit (TCU) 10.

Generally, the cold plate assembly 55 is an assembly that includes the transfer plate 56 and other components as necessary for providing a substantially sealed embodiment of the evaporator chamber 45. The cold plate assembly 55 includes a body 52 to which the transfer plate 56 is mounted. A gasket, sealing ring or other type of seal may be disposed between the body 52 and the transfer plate 56 to ensure the evaporator chamber remains substantially sealed.

The temperature control module 5 may further include a thermoelectric cooler (TEC) 43. In the embodiment shown, the thermoelectric cooler (TEC) 43 is of a planar form. In this example, the thermoelectric cooler (TEC) 43 is in thermal contact with the transfer plate 56 of the cold plate assembly 55. In turn, the thermoelectric cooler (TEC) 43 is in thermal contact with a pedestal mounting plate 57. In some embodiments, the thermoelectric cooler (TEC) 43 is not included in the temperature control module 5. In other embodiments, additional instances of the thermoelectric cooler (TEC) 43 are included in the temperature control module 5.

In the embodiment shown, the pedestal mounting plate 57 serves dual purposes. That is, the pedestal mounting plate 57 provides a base to a housing that surrounds the cold plate assembly 55. Additionally, the pedestal mounting plate 57 includes at least one heater 42. The at least one heater 42 may include a resistive element. Other components for providing heating may be included or provided in place of the resistive element. In some other embodiments, the at least one heater 42 is not included. In some further embodiments, the at least one heater 42 is incorporated separately from the pedestal mounting plate 57, or in a different configuration than the one shown.

The pedestal mounting plate 57 may include a throughway (not shown). The through-way may be included to provide for electrical connection with sensor assembly 59. Generally, sensor assembly 59 is configured to be in thermal contact with the device under test (DUT) 12 and to sense temperature of the device under test (DUT) 12. In addition to a sensing element, the sensor assembly 59 may include components of materials for providing efficient thermal communication with the device under test (DUT) 12.

As discussed herein, it should be noted that terms of orientation such as "above" or "below" are relatively arbitrary. Generally, the discussion here in is with relation to the orientation shown in FIGS. 1, 2 and 3, where the temperature control module 5 of the thermal control unit (TCU) 10 is oriented "below" the connection module 6. However, such terminology is used merely for convention and explanation.

It should be recognized that for example, the thermal control unit (TCU) 10 may be operated on its side, inverted or in another orientation as is deemed appropriate.

Figure 6:
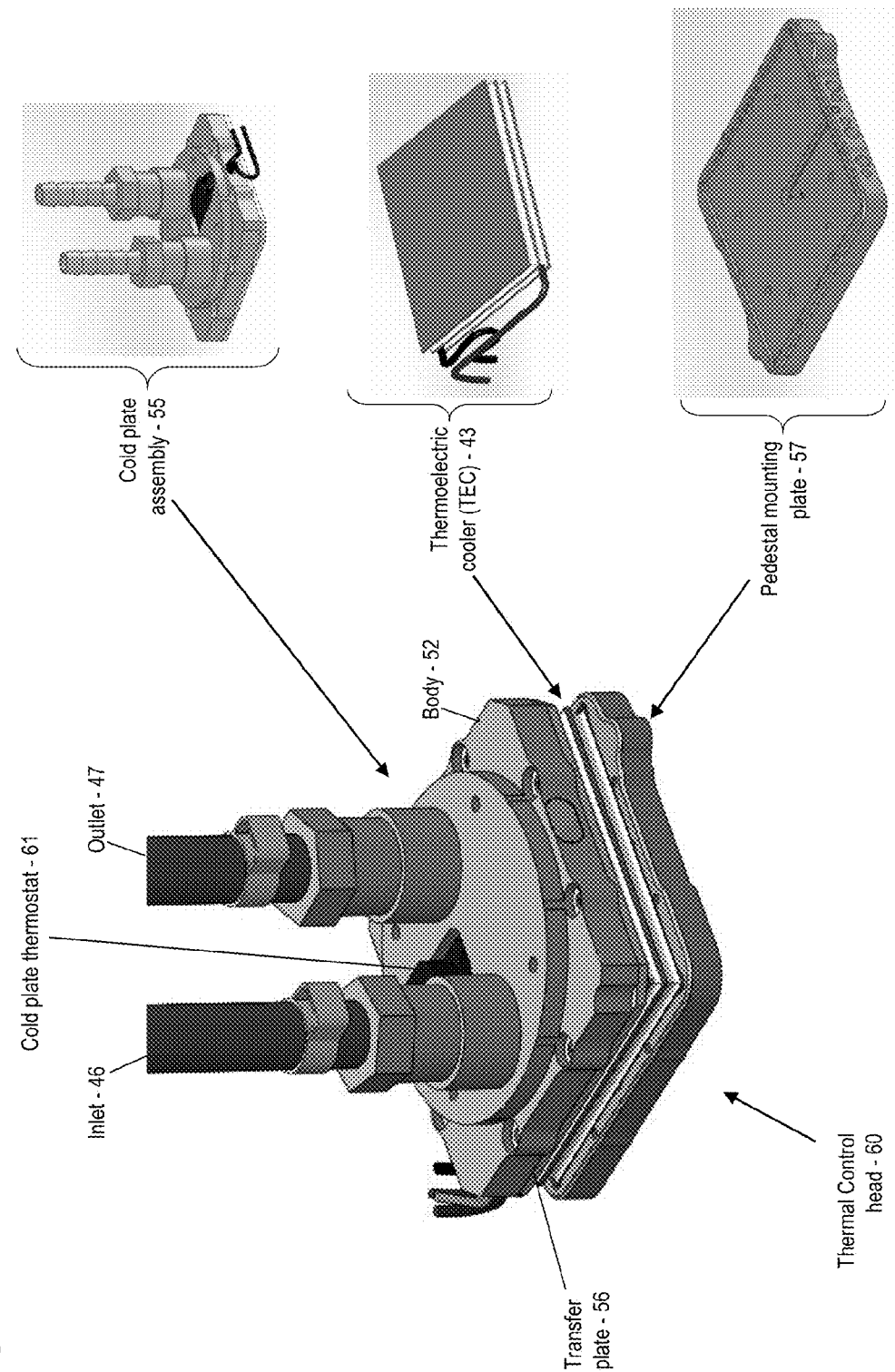
FIG. 6 is an exploded view of a thermal control head used in the temperature control module of FIGS. 4 and 5.

Refer now to FIG. 6, where components of the temperature control module 5 are shown in greater detail. In this illustration, a thermal control head 60 is shown in an exploded view. Generally, the thermal control head 60 includes components of the thermal control unit (TCU) 10 that provide for temperature control. More specifically, the thermal control head 60 includes the cold plate assembly 55, the thermoelectric cooler (TEC) 43 and the pedestal mounting plate 57 (which includes the at least one heater 42 disposed there in). Additionally, the thermal control head 60 may include at least one sensor. For example, the thermal control head 60 may include a cold plate thermostat 61.

Figure 7:
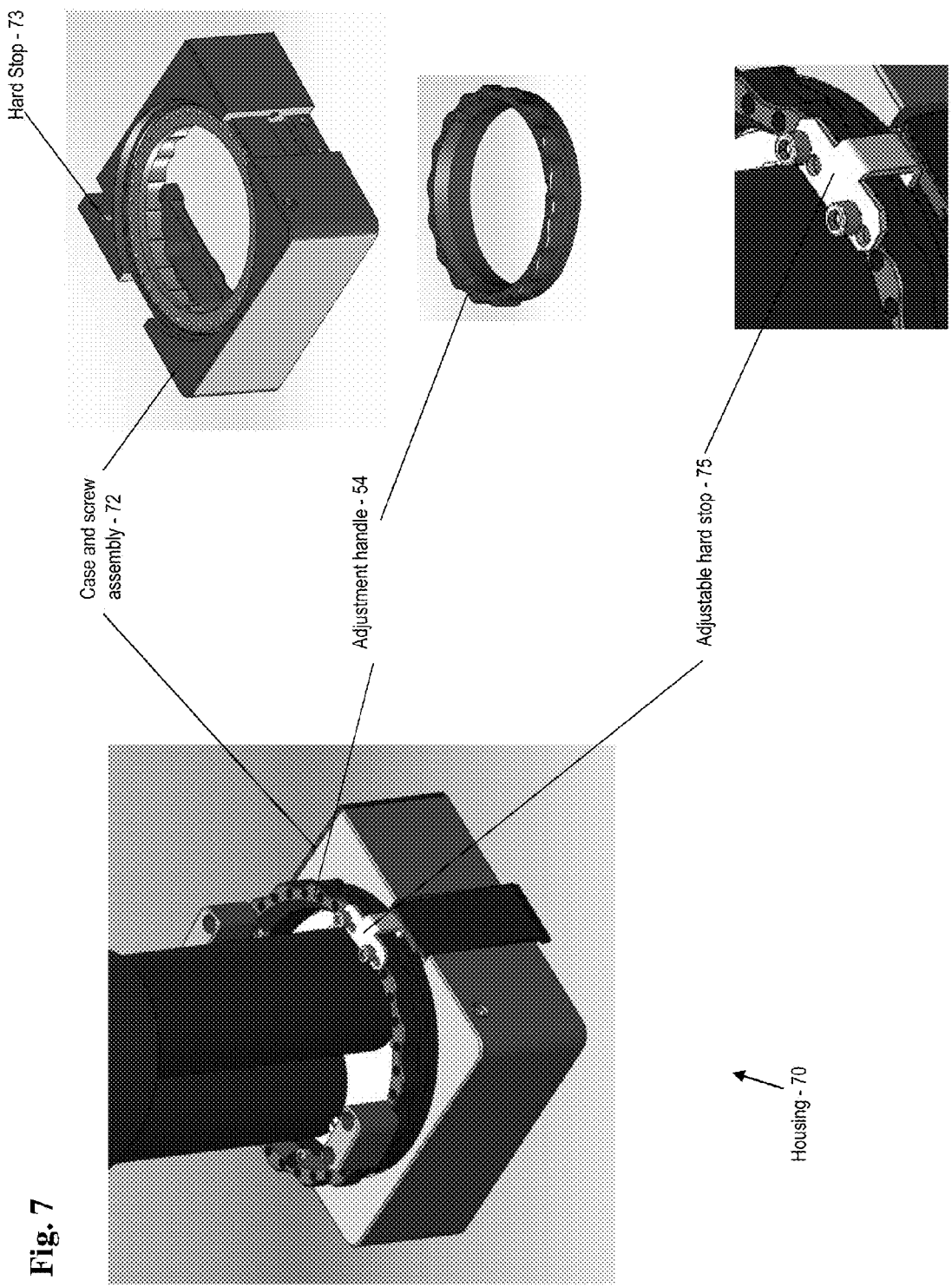
FIG. 7 is an exploded view of a housing for the thermal control head of FIG. 6.

Refer now to FIG. 7, which depicts an exploded view of a housing 70. Generally, the housing 70 includes an integrated case and screw assembly 72. The case and screw assembly 72 may include a hard stop 73. Once the thermal control head 60 has been oriented within the case and screw assembly 72, adjustment handle 54 may be screwed down around the thermal control head 60 and into the case and screw assembly 72. Thus, when assembled, the thermal control head 60 is mechanically secured within the housing 70. The adjustment handle 54 may be locked in place with the addition of adjustable hard stop 75. Generally, adjustable hard stop 75 may include at least one bracket and at least one bolt for locking the adjustment handle 54 to the case and screw assembly 72. In this example, the at least one bolt penetrates a bolt-hole in the periphery of the adjustment handle 54 and is secured into the hard stop 73.

Refer now to FIG. 8, where an underside of the temperature control module 5 is shown. As may be seen in FIG. 8A, the pedestal mounting plate 57 may include a plurality of mounting features for mounting of the device adapter 81. Generally, the thermal control unit (TCU) 10 may be outfitted with a plurality of device adapters 81. For example, each one of the device adapters 81 may be configured for efficient thermal exchange with a particular device under test (DUT) 12.

Generally, each device adapter 81 (as well as other components of the thermal control head 60) are fabricated from materials with regards to heat capacity (over and operational range of temperatures), rigidity, availability, durability, cost and the like. In some embodiments, aluminum is selected as an appropriate material for use in the thermal control head 60 as well as each one of the device adapters 81.

A thermal transfer medium such as thermal paste may be disposed wherever deemed appropriate. Other embodiments of thermal transfer media may be used. For example, thermal interface media may be used. In one embodiment, thermal paste is disposed between each one of the components in the thermal control head 60. Thermal paste may be disposed between the device adapter 81 and the pedestal mounting plate 57 as well as the sensor assembly 59. Thermal transfer media may be selected with regard for performance (thermal conductivity), availability, ease of application, longevity, maintenance requirements, user preference and according to other similar criteria.

Figure 9:
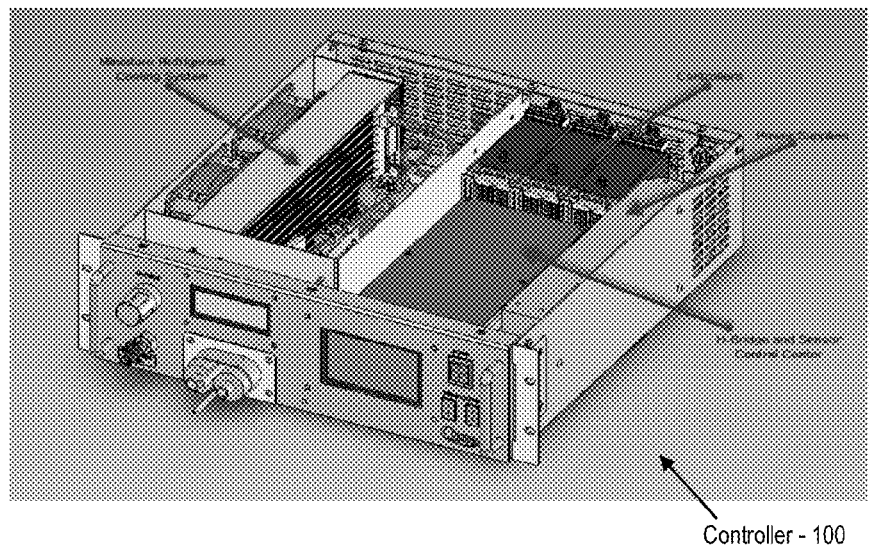
FIG. 9 depicts an exemplary embodiment of a controller for the thermal control unit (TCU) of FIGS. 1, 2 and 3.

Refer now to FIG. 9, wherein illustration of a controller 100 is provided. In this exemplary embodiment, the controller 100 may be configured as a rack-mounted unit. The controller 100 may include the remaining components of the refrigeration loop 9. For example, the controller 100 may include a plurality of fans, a compressor, a condenser, and other such components. Additionally, the controller 100 may include appropriate power supplies, as well as monitoring equipment for monitoring output of the sensor assembly 59. Accordingly, the controller 100 may include at least one interface (not shown). The at least one interface may be an interface with, for example, a personal computer, a network or the like. The controller 100 may include connections with other components such as a supply of dry air.

Figure 10:
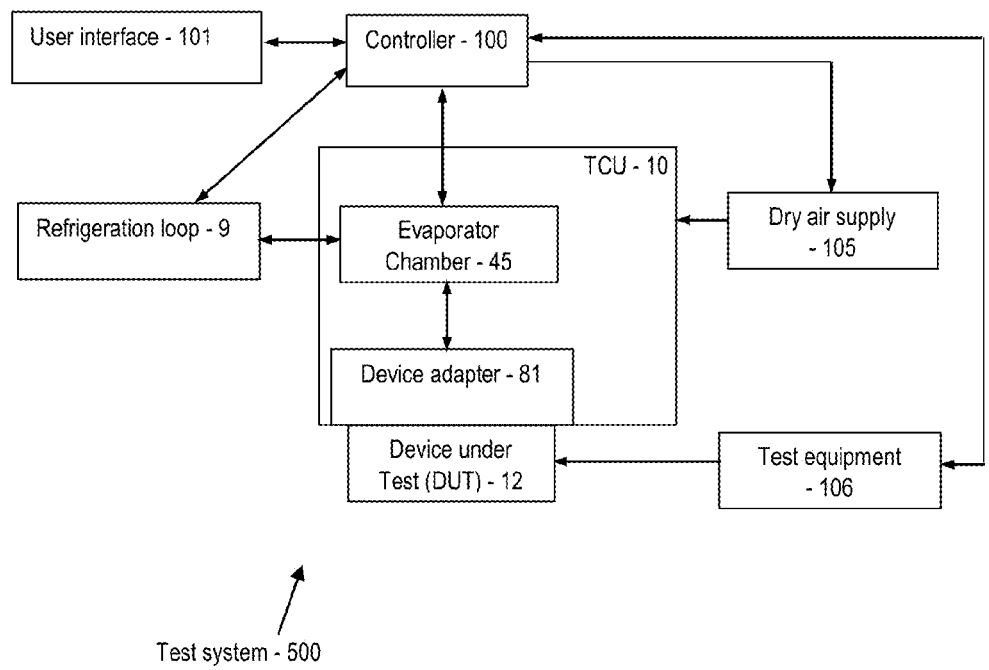
FIG. 10 is a flowchart relating components of a system for using the thermal control unit (TCU) of FIGS. 1, 2 and 3; and, FIG. 11 is a graph depicting performance of the system of FIG. 10.

Refer now to FIG. 10 for a flow chart depicting an exemplary test system 500 is provided. In the test system 500, the controller 100 is commanded by a user through user interface 101. Accordingly, the controller 100 controls the refrigeration loop 9, a dry air supply 105 and the thermal control unit (TCU) 10. The thermal control unit (TCU) 10 is thermally coupled to the device under test (DUT) 12. Additionally, in this embodiment, the controller 100 is interfaced with test equipment 106. Test equipment 106 is used for at least one of monitoring and controlling performance of the device under test (DUT) 12 during the testing. That is, the test equipment 106 may provide for monitoring output signals of the device under test (DUT) 12 and additionally for controlling input signals to the device under test (DUT) 12.

Accordingly, at least one of the controller 100 and the user interface 101 may include instructions for performing testing of the device under test (DUT) 12. The instructions may be provided as a computer program product that includes machine executable instructions stored on machine readable media. The machine readable media may include, for example, nonvolatile storage such as a hard drive, an optical drive or the like. Instructions may be loaded into memory of the controller 100 and/or the user interface 101 from a remote system (not shown). As a matter of convention, the instructions for performing testing are referred to herein as "software," and may include additional instructions as deemed necessary or appropriate. For example, the software may include instructions for providing user interface, output, communications and other tasks associated with performing the testing.

Generally, the software may include data tables such as tables containing desired values for selected performance parameters for an array of devices that may be tested. The software may include data logging features. For example, the software may be configured to monitor performance of a plurality of thermal control unit (TCU) 10, each device adapter 81 and the like.

The software may include logic as appropriate. For example, the software may initiate a given test procedure as a result of device performance. Additionally, the software may provide for adjusting heating, cooling, applied voltages and the like according to a predetermined test procedure, or as a result of performance data collected during the testing.

Figure 11:
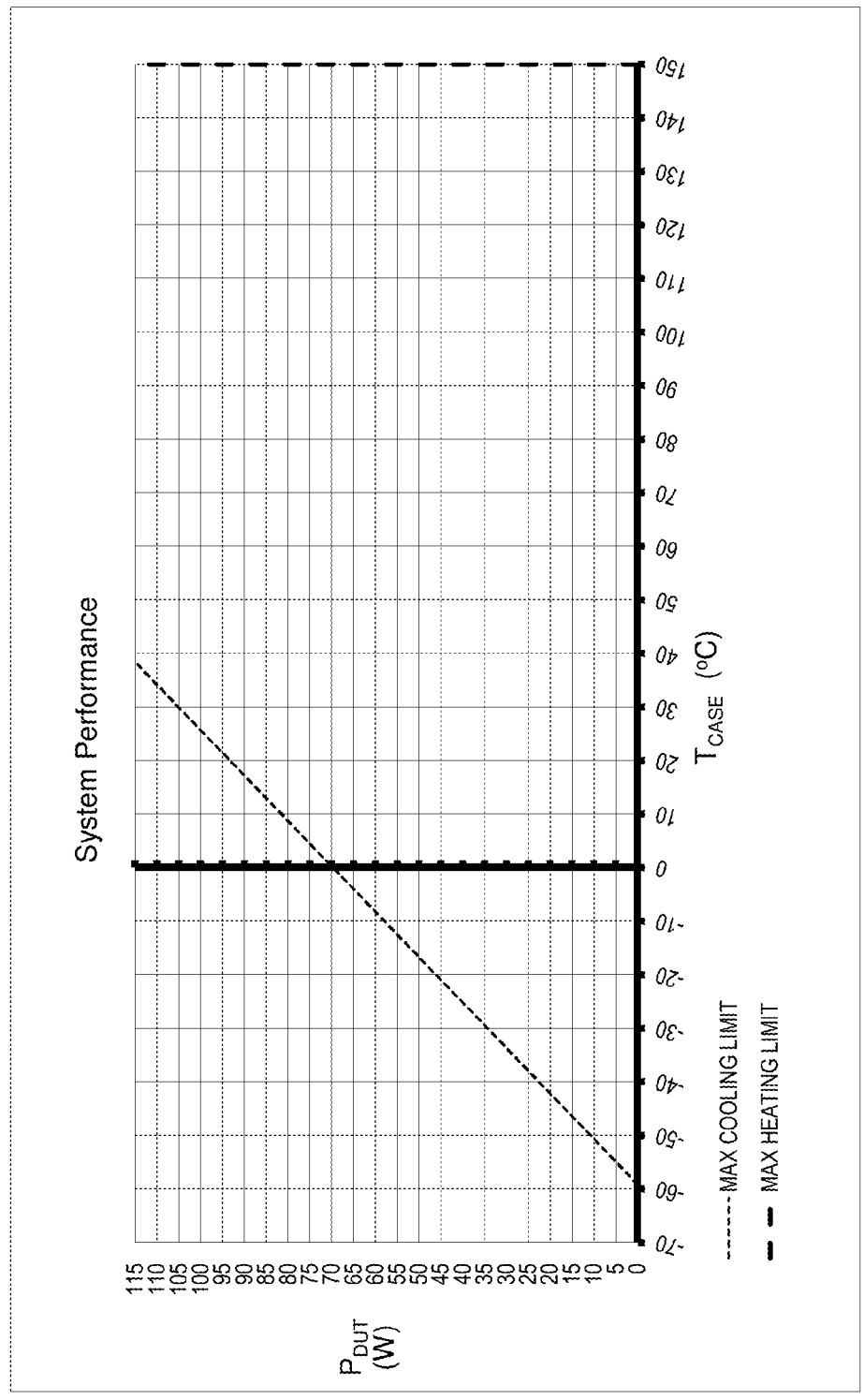

FIG. 11 depicts exemplary operational area for the test system 500. In the graph provided, an achievable target temperature zone is shown to the right of the max cooling limit curve and to the left of the max heating curve.

Having thus described aspects of the thermal control unit (TCU) 10, the controller 100 and the test system 500 for implementing the thermal control unit (TCU) 10 in the controller 100, aspects of further embodiments are now introduced.

Generally, the physical size of the components included in the thermal control unit (TCU) 10, the controller 100 and the test system 500 are limited only by performance as well as the needs of a user. It is not necessary that any particular component be provided as described in the foregoing description. For example, it is not necessary that a compressor be included in the controller 100. In fact, components of the refrigeration loop 9 (that is, refrigeration components that are not included in the thermal control unit (TCU) 10) may be entirely separated from the controller 100.

Further, the refrigeration loop 9 may include additional components as deemed appropriate. For example, additional compressors, fans, evaporators, hoses, valves, line dryers, filters and the like may be included. Generally, the refrigeration loop 9 is operating with readily available refrigerant. For example, the refrigeration loop 9 may be operated with R404a, R134a or other types of refrigerants. Operation of the refrigeration loop 9 may be monitored and controlled with a separate control system or by the controller 100.

Generally, temperature control module 5 (i.e., the housing 70 and the thermal control head 60 therein) may be readily assembled or disassembled. The simple design and construction facilitate maintenance on individual components without constructive dismantling.

The temperature control module 5 may include additional sensors and controls (not shown) as deemed appropriate. For example, additional temperature sensors may be included within the temperature control module 5. The additional temperature sensors may provide, for example, additional information on performance of thermal control unit (TCU) 10, and thereby enhance control of temperature profile at an interface with the device under test (DUT) 12. As another example, electrical performance of the resistive elements in the heater 42 may be monitored. Flow rate of refrigerant may be controlled by flow control valve and or the like. The temperature control module 5 may include additional components such as at least one fan, an air vent and the like. A humidity sensor may be included to monitor ambient moisture.

For example, sensors such as temperature and humidity sensors may be deployed at the evaporator. Temperature sensors (e.g., RTD, thermistor, thermocouple) may be used to measure surface temperature of the device under test (DUT) 12. The housing 70 may include temperature sensors. Auxiliary heaters may be included within the housing 70. Additional thermoelectric or similar other (e.g., thermionic) devices may be included.

The housing 70 may include electrical elements as appropriate. For example, the housing may include electrical connection such that the thermoelectric cooler (TEC) 43 and/or the heater 42 may plug-in when mounted into the housing 70.

The thermal control unit (TCU) 10 may be tuned to provide a high degree of performance and control. For example, in order to cool the device under test (DUT) 12 (reduce temperature), the heat exchange path is drawn from the device under test (DUT) 12 to the evaporator chamber 45. Similarly, to heat the device under test (DUT) 12 (increase temperature), heat exchange must flow from the heater 42 to the device under test (DUT) 12. This latter functionality of these particular components, allows the phase change subsystem to work in only supplying a cold coolant supply to the point of use, primarily during cooling mode of operation on the DUT. During the heating operation, the phase change subsystem can be tuned to operate minimally.

Accordingly, the TCU provides users with a system for thermal testing of a device. The thermal testing capabilities include subjecting the device under test (DUT) 12 to a desired setpoint target temperature, a desired ramp rate to temperature, a desired heat flux for a particular device size and rating.

The technology directly simplifies the cooling system complexity that is typically implemented for semiconductor test hardware. Compared to prior art coolant systems, the technology disclosed herein eliminates the need for secondary (i.e., chiller, coolant equipment, and the like) which would typically cool and reject heat, as well as control temperature, for the primary coolant. Whereas those systems can provide both cold and hot coolant temperature control, the refrigerant-only coolant would only provide levels of cooling.

The teachings herein also provide a much lower coolant temperature than can be realized with most standard coolants, without resorting to specialized heat transfer fluids and associated special chiller and components.

Also, the direct wetted interface that occurs, at the evaporator, between the refrigerant and the thermal load, provides a much higher heat transfer coefficient than can be realized with most fluids. Because of this, the thermal resistance is significantly reduced, and this can additionally allow efficient use of miniaturized components, (i.e., finned heat exchange surfaces), thereby allowing a much more attractive compact test vehicle form factor for socket-on-PCB applications associated with the semiconductor test industry.

Generally, methods and apparatus disclosed herein make use of a direct two-phase coolant system for semiconductor testing, as well as use of a very low temperature coolant (i.e., about minus 40 degrees Celsius).

The system provides miniaturization and includes a very compact compressor as well as evaporator components. It exhibits substantial compactness and is fittable to a 2-3 U standard rack case form factor. Compact evaporator design, fitted to standard semiconductor test socket fixtures with head outline dimensions at 60 mm×60 mm and 40 mm×40 mm.

The system includes precise evaporator-DUT interface temperature control, wherein compressor controller and refrigerant circulation is directly linked with the main control system. Further, the system eliminates risk of coolant leakage associated with standard test setups with fluid system hookups.

The system is capable of a fast system startup area. It also includes a self contained thermal system controller with no external cooling units required. Thermal control methodology that reduces the TEC power during heating to a predetermined percentage of the heater power to dramatically improve TEC life during operation. Further, mechanical improvements to TEC retention method to improve TEC life.

State-of-the-art temperature control systems in the semiconductor test industry, have utilized coolant systems such as air, water, ethylene-glycol mixtures, and other special heat transfer fluids. In most of these systems, a chiller unit is needed to secondarily control the temperature of the principal coolant fluid. By eliminating this secondary system, and directly using the primary refrigerant as the principal fluid, system complexity can be reduced, cooling performance can be more efficiently realized, and cost savings can be gained. In particular, the refrigerant used can alone achieve temperatures which are much lower (i.e., colder), than can be achieved with water, ethylene-glycol mixtures and similar heat transfer fluids, without resorting to specialized secondary hardware (i.e., a chiller).

The refrigerant system, when coupled at the evaporator, with the local temperature control system, can be used to cool or heat a device such as a semiconductor chip. In standard semiconductor test situations, this system would be directly attached to the socket and PCB environment.

The cooling system circulates the low temperature refrigerant to the evaporator which receives the thermal load associated with a device under test (referred to as "DUT"), and then removes this load via a compact air-cooled condenser.

The coolant system is directly monitored and controlled, and for heating situations (i.e., raising temperature of the DUT) the refrigerant circulation can be reduced to permit easier hot temperature ramp-up.

Various other components may be included and called upon for providing for aspects of the teachings herein. For example, additional materials, combinations of materials and/or omission of materials may be used to provide for added embodiments that are within the scope of the teachings herein.

When introducing elements of the present invention or the embodiment(s) thereof, the articles "a," "an," and "the" are intended to mean that there are one or more of the elements. Similarly, the adjective "another," when used to introduce an element, is intended to mean one or more elements. The terms "including" and "having" are intended to be inclusive such that there may be additional elements other than the listed elements.

While the invention has been described with reference to exemplary embodiments, it will be understood by those skilled in the art that various changes may be made and equivalents may be substituted for elements thereof without departing from the scope of the invention. In addition, many modifications will be appreciated by those skilled in the art to adapt a particular instrument, situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A thermal control unit (TCU) for controlling temperature of a device under test (DUT), the unit comprising:
    a sealed evaporation chamber disposed therein, the evaporation chamber configured with a refrigerant inlet and a refrigerant outlet; and
    at least one surface for thermal engagement of the device under test and configured to conduct heat to the evaporation chamber,
    wherein the evaporation chamber is disposed within a cold plate assembly.

2. The thermal control unit (TCU) as in claim 1, wherein the cold plate assembly comprises a body and a transfer plate mounted thereto.

3. The thermal control unit (TCU) as in claim 2, wherein the cold plate assembly comprises a seal disposed between the body and the transfer plate.

4. The thermal control unit (TCU) as in claim 2, wherein the transfer plate is configured to transfer heat from the DUT to the refrigerant.

5. The thermal control unit (TCU) as in claim 4, wherein the transfer plate comprises features for providing efficient heat exchange between the transfer plate and refrigerant.

6. The thermal control unit (TCU) as in claim 1, further comprising at least one thermoelectric cooler (TEC).

7. The thermal control unit (TCU) as in claim 1, further comprising at least one pedestal mounting plate.

8. The thermal control unit (TCU) as in claim 7, wherein the at least one pedestal mounting plate comprises a mount for a sensor assembly.

9. The thermal control unit (TCU) as in claim 8, further comprising a sensor assembly fixed within the mount for a sensor assembly, wherein the sensor assembly further comprises a mount for a device adapter.

10. The thermal control unit (TCU) as in claim 9, further comprising a device adapter fixed within the mount for a device adapter, wherein the device adapter is configured for thermal transfer from the device under test.

11. The thermal control unit (TCU) as in claim 1, further comprising at least one heater.

12. The thermal control unit (TCU) as in claim 1, further comprising a thermal transfer material disposed on at least one surface of a transfer plate, a thermoelectric cooler, a pedestal mounting plate and a sensor assembly.

13. A thermal control unit (TCU) for controlling temperature of a device under test (DUT), the unit comprising:
    a temperature control module having: a body housing an evaporation chamber, the evaporation chamber being configured with a refrigerant inlet and a refrigerant outlet; a transfer plate mounted to the body and being sealed thereto, the transfer plate being at least partially disposed within the evaporation chamber and being configured to transfer heat from the DUT to a refrigerant within the evaporation chamber; and a heater in thermal contact with the DUT; and
    a connection module sealed to the temperature control module, the connection module configured to transfer a compressed refrigerant into the evaporation chamber via the refrigerant inlet and remove heated refrigerant from the evaporation chamber via the refrigerant outlet.

14. The thermal control unit (TCU) as in claim 13, wherein the temperature control module further includes a pedestal mounting plate, the pedestal mounting plate housing the heater and being disposed between the transfer plate and the device under test.

15. The thermal control unit (TCU) as in claim 14, wherein the pedestal mounting plate includes a mount for a sensor assembly.

16. The thermal control unit (TCU) as in claim 15, further comprising a sensor assembly fixed within the mount for a sensor assembly, wherein the sensor assembly further includes a mount for a device adapter.

17. The thermal control unit (TCU) as in claim 16, further comprising a device adapter fixed within the mount for a device adapter, wherein the device adapter is configured for thermal transfer from the DUT.

18. The thermal control unit (TCU) as in claim 13, wherein the compressed refrigerant is one of the following: R404a and R134a.

19. The thermal control unit (TCU) as in claim 13, further comprising at least one thermoelectric cooler (TEC).

20. The thermal control unit (TCU) as in claim 13, wherein the transfer plate includes a plurality of thermally conductive components, the components extending from the transfer plate into the evaporation chamber to transfer heat from the DUT to refrigerant within the evaporation chamber.

* * * * *